United States Patent
Chung et al.

(10) Patent No.: US 7,255,925 B2
(45) Date of Patent: Aug. 14, 2007

(54) THERMOSETTING RESIN COMPOSITION FOR HIGH SPEED TRANSMISSION CIRCUIT BOARD

(75) Inventors: Hyuk-Sung Chung, Seoul (KR); Bong-Jin Jeon, Daejeon (KR); Hyun-Cheol Kim, Daejeon (KR); Eun-Hae Koo, Daejeon (KR)

(73) Assignee: LG Chem, Ltd. (KR)

( * ) Notice: Subject to any disclaimer, the term of this patent is extended or adjusted under 35 U.S.C. 154(b) by 393 days.

(21) Appl. No.: 10/934,851

(22) Filed: Sep. 3, 2004

(65) Prior Publication Data

US 2005/0080183 A1    Apr. 14, 2005

(30) Foreign Application Priority Data

Sep. 5, 2003    (KR) .................... 10-2003-0062096

(51) Int. Cl.
*B32B 15/092*    (2006.01)
*B32B 27/06*    (2006.01)
*B32B 27/20*    (2006.01)
*B32B 27/38*    (2006.01)
*C08L 63/00*    (2006.01)

(52) U.S. Cl. .................. 428/416; 428/413; 428/418; 428/901; 525/523; 525/528; 523/457; 523/459; 523/461; 523/466

(58) Field of Classification Search .................. None
See application file for complete search history.

(56) References Cited

U.S. PATENT DOCUMENTS

| | | | |
|---|---|---|---|
| 6,156,831 A * | 12/2000 | Sase et al. .................. 524/101 |
| 6,162,876 A | 12/2000 | Yeager et al. | |
| 6,245,841 B1 | 6/2001 | Yeager et al. | |
| 2006/0167189 A1 * | 7/2006 | Mizuno et al. ............. 525/396 |

FOREIGN PATENT DOCUMENTS

| | | |
|---|---|---|
| JP | 63-33505 | 2/1988 |
| JP | 11-21453 | 1/1999 |
| JP | 11-21507 | 1/1999 |
| JP | 11-263940 | 9/1999 |
| JP | 2000-239496 | 9/2000 |
| JP | 2001-214053 | 8/2001 |
| JP | 2001-339130 | 12/2001 |
| KR | 2001-0101310 | 11/2001 |
| KR | 2002-0044342 | 6/2002 |
| KR | 2002-0085475 | 11/2002 |
| WO | WO 2004/029127 A1 * | 4/2004 |

OTHER PUBLICATIONS

Machine translation of JP 2000-239496, provided by the JPO website.*
Machine translation of JP 11-263940, provided by the JPO website.*

* cited by examiner

*Primary Examiner*—Michael J. Feely
(74) *Attorney, Agent, or Firm*—Cantor Colburn LLP

(57) ABSTRACT

The present invention relates to a thermosetting resin composition for a high speed transmission circuit board, more particularly to a thermosetting resin composition having superior dielectric characteristics with low dielectric constant and dissipation factor and having superior glass transition temperature, heat resistance after moisture absorption, dielectric reliability, adhesion to copper film, workability, dispersibility of inorganic filler, electric characteristics, etc., and thus being useful for a copper clad laminate for high speed signal transfer.

13 Claims, No Drawings

THERMOSETTING RESIN COMPOSITION FOR HIGH SPEED TRANSMISSION CIRCUIT BOARD

BACKGROUND OF THE INVENTION (a) Field of the Invention

The present invention relates to a thermosetting resin composition for a high speed transmission circuit board, more particularly to a thermosetting resin composition having superior dielectric characteristics with low dielectric constant and dissipation factor and having superior glass transition temperature, heat resistance after moisture absorption, dielectric reliability, adhesion to copper film, workability, dispersibility of inorganic filler, electric characteristics, etc., and thus being useful for a copper clad laminate for high speed signal transfer.

(b) Description of the Related Art

Recently, electronic devices such as computers and communication devices, etc. are being more highly integrated and multilayered. And, mobile phones, notebook computers, etc. are becoming more small-sized, light and capable. As printed circuit boards mounted on these devices are becoming more integrated and compact, superior heat resistance and dielectric reliability are required. With the development of high speed communication services, signal delay and transmission loss of high speed transmission circuit boards mounted on communication devices are emerging as problem. Because the signal delay is proportional to the square root of the dielectric constant of an insulator and the transmission loss is proportional to the dielectric constant of the insulator and the dissipation factor, a material having low dielectric constant and dissipation factor is required for a high speed transmission circuit board.

In the conventional FR-4 printed circuit board, an epoxy resin composition comprising a brominated difunctional epoxy resin, a multifunctional epoxy resin, an amine based curing agent, an imidazole curing accelerator, etc. is used. The polar groups resultant from the reaction of the epoxy resin and the amine based curing agent increase the dielectric constant and the dissipation factor, so that it is impossible to obtain transmission characteristics sufficient for high speed transmission.

In order to solve this problem, Korea Laid-Open Publication No. 2002-0044342 discloses a method of using an acid anhydride based epoxy curing agent and Korea Laid-Open Publication No. 2002-0085475 discloses a method of using a dicyclopentadiene based epoxy resin, which has low dielectric constant. However, epoxy resin is limited in offering sufficiently low dielectric constant and dissipation factor required for high speed and high frequency transmission.

Thus, use of a thermoplastic resin such as a fluorine based resin, polyphenylene ether, etc. or a composite resin of polyphenylene ether and epoxy resin, which have low dielectric constant and dissipation factor, has been proposed. However, these resins require high temperature and pressure for processing because of high melting point or softening point and have inferior processing characteristics and adhesion to copper film.

Use of a cyanate ester resin, which has the lowest dielectric constant among thermosetting resins, offers low dielectric constant and dissipation factor. But, the dielectric reliability worsens because triazine, which is included in the resin, has poor heat resistance after moisture absorption.

In order to solve this problem, Japanese Patent Publication No. 2000-239496 discloses a method of mixing a cyanate ester resin with a dicyclopentadiene based epoxy resin, which has low dielectric constant and dissipation factor, to reduce dielectric constant and dissipation factor and improve heat resistance after moisture absorption. However, this method does not offer electric characteristics sufficient for a high speed transmission circuit board.

In order to improve dielectric characteristics and heat resistance after moisture absorption of cyanate ester, U.S. Pat. Nos. 6,162,876, 6,245,841, Japanese Laid-Open Publication No. 1999-21507 and Japanese Laid-Open Publication No. 1999-21453 disclose a method of decreasing dielectric constant and dissipation factor by mixing a phenol-modified cyanate ester oligomer with polyphenylene ether. However, this method is also limited in that the heat resistance after moisture absorption worsens. Japanese Laid-Open Publication No. 1999-263940 discloses a method of mixing a phenol-modified cyanate ester oligomer with a cyclic olefin copolymer and Japanese Laid-Open Publication No. 2001-214053 discloses a method of mixing a phenol-modified cyanate ester oligomer with polystyrene. However, these methods are limited in that the heat resistance after moisture absorption and the adhesion to copper film is very low because of insufficient compatibility with cyanate ester.

Japanese Laid-Open Publication No. Sho 63-33505 discloses a method of adding an inorganic filler to improve the performance of a clad laminate. However, as the inorganic filler is mixed with varnish, the filler is slowly deposited in an impregnation tank during prepreg preparation, and thereby worsens workability. Also, the appearance of the prepreg becomes poor, the dispersibility of the inorganic filler becomes non-uniform, so that the interfacial adhesion of the clad laminate, drilling characteristics and insulating characteristics worsen.

Japanese Laid-Open Publication No. 2001-339130 discloses a method of improving dispersibility of the inorganic filler, offering the clad laminate formability and processing characteristics comparable to those of an epoxy resin and improving heat resistance and dielectric reliability by adding an inorganic filler treated with a silicon polymer having an hydroxyl group to a cyanate ester resin and polyphenylene ether. However, this method requires an additional process of treating the inorganic filler with the silicon polymer. And, the content of the inorganic filler should be increased to increase heat resistance after moisture absorption of the clad laminate, which increases the viscosity of varnish and thus makes the processing difficult.

Accordingly, a thermosetting resin having superior dielectric characteristics with low dielectric constant and dissipation factor and being capable of improving heat resistance after moisture absorption and dispersibility of inorganic filler is necessary.

SUMMARY OF THE INVENTION

It is an aspect of the present invention to provide a thermosetting resin composition having superior dielectric characteristics with low dielectric constant and dissipation factor and being capable of greatly improving glass transition temperature, heat resistance after moisture absorption, dielectric reliability, adhesion to copper film, workability, dispersibility of inorganic filler, electric characteristics, etc.

It is another aspect of the present invention to provide a copper clad laminate for high speed signal transfer capable of reducing dielectric constant and dissipation factor and offering superior heat resistance after moisture absorption, dielectric reliability, adhesion to copper film, electric characteristics, etc. and suitable for multilayering and high speed signal transfer.

DETAILED DESCRIPTION OF THE PREFERRED EMBODIMENTS

To attain the aspects, the present invention provides a thermosetting resin composition for a high speed transmission circuit board comprising:

a) a cyanate ester based resin having at least two cyanate groups in one molecule;
b) a dicyclopentadiene based epoxy resin;
c) a fumed silica;
d) a thermoplastic resin;
e) a cyanate ester resin curing accelerator;
f) an epoxy resin curing accelerator;
g) a primary phenolic compound; and
h) a flame retardant.

The present invention also provides a copper clad laminate for high speed signal transfer comprising the thermosetting resin composition.

Hereinafter, the present invention is described in more detail.

The present inventors worked on a thermosetting resin having superior dielectric characteristics with low dielectric constant and dissipation factor and being capable of improving heat resistance after moisture absorption and dispersibility of inorganic filler. In doing so, they found out that dielectric constant and dissipation factor are reduced and glass transition temperature, heat resistance after moisture absorption, dielectric reliability, adhesion to copper film, workability, dispersibility of inorganic filler, electric characteristics, etc. are significantly improved by mixing a cyanate ester based resin having at least two cyanate groups in one molecule, a dicyclopentadiene based epoxy resin, a fumed silica and a thermoplastic resin.

The present invention is characterized by a thermoplastic resin composition for a circuit board for high speed signal transfer comprising a cyanate ester based resin having at least two cyanate groups in one molecule, a dicyclopentadiene based epoxy resin, a fumed silica, a thermoplastic resin, a cyanate ester resin curing accelerator, an epoxy resin curing accelerator, a primary phenolic compound and a flame retardant.

Preferably, the thermosetting resin composition for a high speed transmission circuit board of the present invention comprises:

a) 100 parts by weight of a cyanate ester based resin having at least two cyanate groups in one molecule;
b) 50 to 300 parts by weight of a dicyclopentadiene based epoxy resin;
c) 0.5 to 10 parts by weight of a fumed silica per 100 parts by weight of the cyanate ester based resin and the dicyclopentadiene based epoxy resin;
d) 5 to 100 parts by weight of a thermoplastic resin;
e) 5 to 300 ppm of a cyanate ester resin curing accelerator;
f) 0.05 to 3 parts by weight of an epoxy resin curing accelerator per 100 parts by weight of the dicyclopentadiene based epoxy resin;
g) 1 to 30 parts by weight of a primary phenolic compound; and
h) 5 to 50 parts by weight of a flame retardant per 100 parts by weight of the cyanate ester based resin and the dicyclopentadiene based epoxy resin.

Preferably, a) the cyanate ester based resin having at least two cyanate groups in one molecule is a compound represented by Formula 1 below:

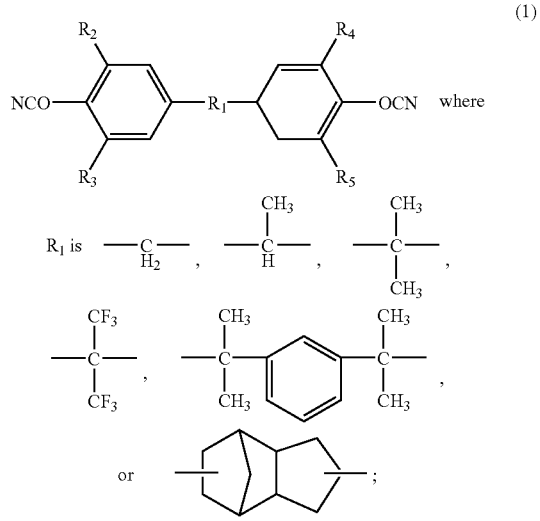

each of $R_2$, $R_3$, $R_4$ and $R_5$ is hydrogen or $CH_3$.

Specifically, the cyanate ester based resin having at least two cyanate groups in one molecule may be 2,2-bis(4-cyanatephenyl)propane, bis(3,5-dimethyl-4-cyanatephenyl)methane, 2,2-bis(4-cyanatephenyl)-1,1,1,3,3,3-hexafluoropropane, etc.

Preferably, the cyanate ester based resin having at least two cyanate groups in one molecule is prepolymerized from a monomer. If the monomer is treated with varnish, impregnation may become impossible due to recrystallization. Thus, the content of the monomer is preferably 10 to 70 mol %, more preferably 30 to 60 mol %. If the content of the monomer is below 10 mol %, recrystallization may occur. Otherwise, if it exceeds 70 mol %, the varnish becomes too viscous, so that impregnation becomes difficult and storage stability of the varnish worsens.

b) The dicyclopentadiene based epoxy resin, which is represented by Formula 2 below, has a hydrophobic bicyclic hydrocarbon group with less polarization, and thus has superior dielectric characteristics.

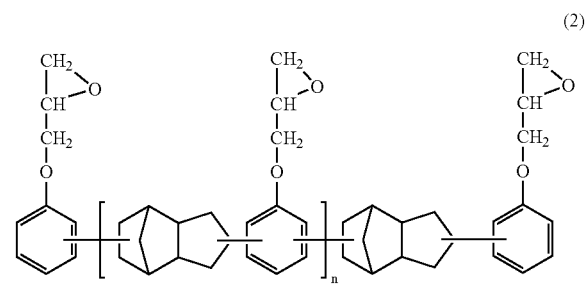

In Formula 2, n is 0 or a positive integer.

Preferably, the dicyclopentadiene based epoxy resin is comprised in 50 to 300 parts by weight per 100 parts by weight of the cyanate ester based resin. If the content is below 50 parts by weight, heat resistance may worsen after moisture absorption. Otherwise, if it exceeds 300 parts by weight, dielectric characteristics may worsen.

c) The fumed silica, a porous nano-sized silica particle, solves the dispersibility problem of the micro-sized silica.

Preferably, the fumed silica has an average diameter ranging from 1 to 100 nm.

Preferably, the fumed silica is comprised in 0.5 to 10 parts by weight per 100 parts by weight of the cyanate ester based resin and the dicyclopentadiene based epoxy resin. If the content is below 0.5 part by weight, heat resistance after moisture absorption may worsen. Otherwise, if it exceeds 10 parts by weight, the varnish becomes too viscous, so that impregnation becomes difficult.

For d) the thermoplastic resin, polystyrene, cyclic olefin copolymer, polyphenylene ether, polyphenylene ether having an epoxy group, etc., which has superior dielectric characteristics, may be used.

Preferably, the thermoplastic resin is comprised in 5 to 100 parts by weight per 100 parts by weight of the cyanate ester based resin. If the content is below 5 parts by weight of, it is impossible to obtain ideal dielectric characteristics. Otherwise, if it exceeds 100 parts by weight, heat resistance after moisture absorption is significantly reduced and adhesion to metal film also worsens.

e) The cyanate ester resin curing accelerator acts as a catalyst promoting curing of the cyanate ester based resin.

For the cyanate ester resin curing accelerator, an organometal or an organometallic complex, specifically with iron, copper, zinc, cobalt, nickel, manganese, tin, etc. may be used. For the organometal, iron naphthenate, copper naphthenate, zinc naphthenate, cobalt naphthenate, iron octanoate, copper octanoate, zinc octanoate, cobalt octanoate, etc. may be used. And, for the organometallic complex, lead acetylacetonate, cobalt acetylacetonate, etc. may be used.

Preferably, the cyanate ester resin curing accelerator is comprised in 5 to 300 ppm, more preferably in 10 to 200 ppm, per 100 parts by weight of the cyanate ester based resin, based on the metal concentration. If the content is below 5 ppm, reactivity and curing characteristics may be insufficient. Otherwise, if it exceeds 300 ppm, reaction control becomes difficult, so that curing happens too fast or forming characteristics may worsen.

For g) the epoxy resin curing accelerator, imidazole derivatives such as 1-methylimidazole, 2-methylimidazole, 2-ethyl-4-methylimidazole, 2-phenylimidazole, 2-cyclohexyl-4-methylimidazole, 4-butyl-5-ethylimidazole, 2-methyl-5-ethylimidazole, 2-octyl-4-hexylimidazole, 2,5-chloro-4-ethylimidazole, etc. may be used.

Preferably, the epoxy resin curing accelerator is comprised in 0.05 to 3 parts by weight per 100 parts by weight of the dicyclopentadiene based epoxy resin. If the content is below 0.05 part by weight, catalytic activity decreases, so that curing time increases. Otherwise, if it exceeds 3 parts by weight, storage stability of varnish or prepreg may worsen significantly.

f) The primary phenolic compound functions as cocatalyst in the curing of the cyanate ester based resin and reduces dielectric constant and dissipation factor. As the cyanate ester based resin is cured, a triazine is formed and unreacted cyanate reacts with the primary phenolic compound to form imide carbonate, thereby reducing polarity and thus reducing dielectric constant and dissipation factor.

The primary phenolic compound is a compound represented by Formula 3 below:

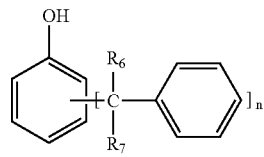

where
each of $R_6$ and $R_7$ is hydrogen or $CH_3$ independently; and n is 1 or 2.

For the primary phenolic compound, nonylphenol, dinonylphenol, octylphenol, 4-cumylphenol, etc., which has superior heat resistance, may be used.

The primary phenolic compound is preferably comprised in 1 to 30 parts by weight, more preferably in 5 to 25 parts by weight, per 100 parts by weight of the cyanate ester based resin. If the content is below 1 part by weight, dielectric characteristics may worsen. Otherwise, if it exceeds 30 parts by weight, heat resistance may worsen.

For h) the flame retardant, a hydrocarbon based less polar compound not inhibiting curing of the cyanate ester based resin and not reducing dielectric characteristics, such as 1,2-dibromo-4-(1,2-dibromoethyl)cyclohexane, tetrabromocyclohexane, hexabromocyclodecane, etc., may be used.

Particularly, it is preferable to use 2,4,6-tris(tribromophenoxy)-1,3,5-triazine represented by Formula 4 below, which is highly compatible with a structure similar to that of the cyanate ester based resin, for the flame retardant.

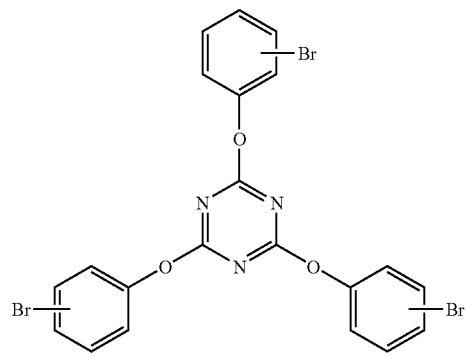

Preferably, the flame retardant is comprised in 5 to 50 parts by weight per 100 parts by weight of the cyanate ester based resin and the dicyclopentadiene based epoxy resin, in the range of having a flame retardance of UL-V0 level. If the content is below 5 parts by weight, flame retardance may be insufficient. Otherwise, if it exceeds 50 parts by weight, heat resistance may be insufficient.

The thermosetting resin composition of the present invention can reduce dielectric constant and dissipation factor and improve heat resistance after moisture absorption, adhesion to copper film and dispersibility of inorganic filler by adding the fumed silica and the thermoplastic resin to the cyanate ester based resin and the dicyclopentadiene based epoxy resin.

The present invention also provides a copper clad laminate for high speed signal transfer comprising the thermosetting resin composition by dissolving or dispersing the thermosetting resin composition in a solvent, impregnating the composition in a substrate and drying it at 80 to 200° C. for a given time to prepare a prepreg for a printed circuit board without B stage adhesivity. For the substrate, the common woven or nonwoven fiber substrate can be used. For the fiber substrate, an inorganic fiber such as glass, alumina, asbestos, boron, silica alumina glass, silica glass, silicon carbide, silicon nitride, etc. or an organic fiber such as aramid, polyether ketone, polyether imide, cellulose, etc. may be used. Especially, a glass woven fiber is preferable. The prepreg is laminated to at least one layer and then a metal film is formed on one or both sides. Then, it is heated, pressed and molded into a copper clad laminate for high speed signal transfer.

Hereinafter, the present invention is described in more detail through examples. However, the following examples are only for the understanding of the present invention and they do not limit the present invention.

EXAMPLES

Example 1

(Preparation of Epoxy Resin Composition)

40 phr of polyphenylene ether (HPP820, GE) was added to 200 phr of toluene contained in a beaker and was completely dissolved. Then, 7 phr of fumed silica (Aerosil R972, Degussa) was added to the solution. After stirring for about 1 hour, 60 phr of 2,4,6-tris(tribromophenoxy)-1,3,5-triazine (SR-245H, Dai-Ichi Kogyo Seiyaku) and 20 phr of 4-cumylphenol were added as flame retardant and primary phenolic compound, respectively, and dissolved. Then, 100 phr of 2,2-bis(4-cyanatephenyl)propane prepolymer (BA230S, Lonza) was added as cyanate ester based resin and dissolved, and then 100 phr of dicyclopentadiene epoxy resin (XD-1000L, Nippon Chemicals) was dissolved. After the constituents were completely dissolved, 0.01 phr of cobalt acetylacetonate and 0.5 phr of 2-ethyl-4-methylimidazole were added as cyanate ester based resin curing accelerator and epoxy resin curing accelerator, respectively. The solution was stirred until the constituents were completely dissolved to obtain a thermoplastic resin composition.

(Preparation of Copper Clad Laminate for High Speed Signal Transfer)

The resultant thermoplastic resin composition was impregnated in a glass fiber and dried at 80 to 200° C. to obtain a prepreg for a printed circuit board without B stage adhesivity. The prepreg was placed on each side of a 35 m-thick copper film and heated and pressed with a vacuum press to prepare a copper clad laminate for high speed signal transfer.

Example 2

A thermoplastic resin composition and a copper clad laminate for high speed signal transfer were prepared in the same manner of Example 1, except for using 100 phr of tetra-o-methyl bisphenol F dicyanate prepolymer (ME240S, Lonza) as cyanate ester based resin.

Example 3

A thermoplastic resin composition and a copper clad laminate for high speed signal transfer were prepared in the same manner of Example 1, except for using 80 phr of 2,2-bis(4-cyanatephenyl)propane prepolymer as cyanate ester resin, 120 phr of dicyclopentadiene epoxy resin, 10 phr of fumed silica, 0.008 phr of cyanate ester resin curing accelerator, 0.6 phr of epoxy resin curing accelerator and 15 phr of primary phenolic compound.

Example 4

A thermoplastic resin composition and a copper clad laminate for high speed signal transfer were prepared in the same manner of Example 1, except for using 40 phr of polystyrene (15NFI, LG) instead of polyphenylene ether.

Comparative Example 1

A thermoplastic resin composition and a copper clad laminate for high speed signal transfer were prepared in the same manner of Example 1, except for not using a fumed silica.

Comparative Example 2

A thermoplastic resin composition and a copper clad laminate for high speed signal transfer were prepared in the same manner of Example 1, except for using 10 phr of a spherical silica (SFP-30M, Denka) instead of a fumed silica.

Comparative Example 3

A thermoplastic resin composition and a copper clad laminate for high speed signal transfer were prepared in the same manner of Example 1, except for using 10 phr of a planar silica (MN-U-SIL5, US Silica) instead of a fumed silica.

Comparative Example 4

A thermoplastic resin composition and a copper clad laminate for high speed signal transfer were prepared in the same manner of Example 1, except for using 100 phr of a cresol novolak epoxy resin (N673, Bakelite) instead of a dicyclopentadiene based epoxy resin.

Comparative Example 5

A thermoplastic resin composition and a copper clad laminate for high speed signal transfer were prepared in the same manner of Example 1, except for using 15 phr of a fumed silica and 150 phr of polyphenylene ether.

For each copper clad laminate for high speed signal transfer prepared in Examples 1 to 4 and Comparative Examples 1 to 5, glass transition temperature, heat resistance after moisture absorption, dielectric characteristics, and adhesion to copper film were measured as follows. The result is given in Table 2 below.

a) Glass transition temperature ($T_g$, ° C.)—Copper film was removed from each copper clad laminate for high speed signal transfer prepared in Examples 1 to 4 and Comparative Examples 1 to 5 using an etching solution. The sample was heated to 250° C. at a rate of 10° C./min using a DSC (differential scanning calorimeter). It was cooled to 30° C. and then heated to 300° C. at a rate of 10° C./min to measure the glass transition temperature.

b) Heat resistance after moisture absorption—Each copper clad laminate for high speed signal transfer prepared in Examples 1 to 4 and Comparative Examples 1 to 5 was cut to a size of 5 cm×5 cm and wetted for 2 hours under a PCT (pressure cooker test, 121° C.) condition. After keeping in a lead bath of 288° C. for 10 seconds, the surface status was observed with eyes. The sample in which delamination was observed was evaluated as X and the one with no delamination was evaluated as ○.

c) Dielectric characteristics—Dielectric constant and dissipation factor were measured at 1 MHz according to JIS C6481, the Japanese standard for copper clad laminate for high speed signal transfer, using an impedance analyzer.

d) Adhesion to copper film (peel strength, kg/cm)—Each copper clad laminate for high speed signal transfer prepared in Examples 1 to 4 and Comparative Examples 1 to 5 was cut to a size of 10 cm×1 cm. Adhesion strength of the clad laminate to the copper film was measured at 0.8 mm/sec using a UTM (universal testing machine).

polyphenylene ether resin had been used, showed poor heat resistance after moisture absorption and adhesion to copper film.

As described above, the thermosetting resin of the present invention has superior dielectric characteristics with low dielectric constant and dissipation factor and is capable of significantly improving glass transition temperature, heat resistance after moisture absorption, dielectric reliability, adhesion to copper film, workability, dispersibility of inorganic filler, electric characteristics, etc., and thus it is useful for a copper clad laminate for multilayering and high speed signal transfer.

TABLE 1

| Classification | | Example | | | | Comparative Example | | | | |
|---|---|---|---|---|---|---|---|---|---|---|
| | | 1 | 2 | 3 | 4 | 1 | 2 | 3 | 4 | 5 |
| Cyanate ester based resin | BA230S | 100 | — | 80 | 100 | 100 | 100 | 100 | 100 | 100 |
| | ME240S | — | 100 | — | — | — | — | — | — | — |
| Dicyclopentadiene based epoxy resin (XD1000L) | | 100 | 100 | 120 | 100 | 100 | 100 | 100 | — | 100 |
| Cresol novolak epoxy resin (N673) | | — | — | — | — | — | — | — | 100 | — |
| Silica | Fumed silica | 7 | 7 | 10 | 10 | — | — | — | 7 | 15 |
| | Spherical silica | — | — | — | — | — | 10 | — | — | — |
| | Planar silica | — | — | — | — | — | — | 10 | — | — |
| Thermoplastic resin | HPP820 | 40 | 40 | 60 | — | 40 | 40 | 40 | 40 | 150 |
| | PS | — | — | — | 40 | — | — | — | — | — |
| Cyanate ester resin curing accelerator | | 0.01 | 0.01 | 0.008 | 0.01 | 0.01 | 0.01 | 0.01 | 0.01 | 0.01 |
| Epoxy resin curing accelerator | | 0.5 | 0.5 | 0.6 | 0.5 | 0.5 | 0.5 | 0.5 | 0.5 | 0.5 |
| Primary phenolic compound | | 20 | 20 | 15 | 20 | 20 | 20 | 20 | 20 | 20 |
| Flame retardant | | 60 | 60 | 60 | 60 | 60 | 60 | 60 | 60 | 60 |

TABLE 2

| Classification | Example | | | | Comparative Example | | | | |
|---|---|---|---|---|---|---|---|---|---|
| | 1 | 2 | 3 | 4 | 1 | 2 | 3 | 4 | 5 |
| Glass transition temperature ($T_g$, °C.) | 210 | 215 | 215 | 220 | 210 | 210 | 210 | 225 | 200 |
| Heat resistance after moisture absorption for 2 hours | ○○○ | ○○○ | ○○○ | ○○○ | X X X | ○ X X | ○ X X | X X X | X X X |
| Dielectric constant | 3.90 | 3.85 | 3.85 | 4.15 | 3.90 | 3.90 | 3.90 | 4.30 | 3.85 |
| Dissipation factor | 0.004 | 0.004 | 0.004 | 0.005 | 0.004 | 0.004 | 0.004 | 0.008 | 0.003 |
| Adhesion to copper film | 1.7 | 1.7 | 1.6 | 1.6 | 1.7 | 1.7 | 1.5 | 1.6 | 1.3 |

As seen in Table 2, the thermoplastic resin compositions and the copper clad laminate for high speed signal transfer of Examples 1 to 4, which had been prepared according to the present invention, were superior in all of glass transition temperature ($T_g$), heat resistance after moisture absorption, dielectric constant, dissipation factor and adhesion to copper film to those of Comparatives Example 1 to 5.

Especially, that of Comparative Example 1, in which the fumed silica had not been used, and those of Comparative Example 2 and Comparative Example 3, in which a spherical silica and a planar silica had been used respectively instead of the fumed silica, showed less heat resistance after moisture absorption. And, that of Comparative Example 4, in which a phenol novolak epoxy resin had been used instead of the dicyclopentadiene epoxy resin, showed low dielectric constant, dissipation factor and heat resistance after moisture absorption were poor. Also, that of Comparative Example 5, in which 15 phr of fumed silica and 150 phr of

What is claimed is:

1. A thermosetting resin composition for a high speed transmission circuit board comprising:
    a) a cyanate ester based resin having at least two cyanate groups in one molecule;
    b) a dicyclopentadiene based epoxy resin;
    c) a fumed silica;
    d) a thermoplastic resin;
    e) a cyanate ester resin curing accelerator;
    f) an epoxy resin curing accelerator;
    g) a primary phenolic compound; and
    h) a flame retardant.

2. The thermosetting resin composition of claim 1, which comprises:
    a) 100 parts by weight of a cyanate ester based resin having at least two cyanate groups in one molecule;
    b) 50 to 300 parts by weight of a dicyclopentadiene based epoxy resin;

c) 0.5 to 10 parts by weight of a fumed silica per 100 parts by weight of the cyanate ester based resin and the dicyclopentadiene based epoxy resin;

d) 5 to 100 parts by weight of a thermoplastic resin;

e) 5 to 300 ppm of a cyanate ester resin curing accelerator;

f) 0.05 to 3 parts by weight of an epoxy resin curing accelerator per 100 parts by weight of the dicyclopentadiene based epoxy resin;

g) 1 to 30 parts by weight of a primary phenolic compound; and h) 5 to 50 parts by weight of a flame retardant per 100 parts by weight of the cyanate ester based resin and the dicyclopentadiene based epoxy resin.

3. The thermosetting resin composition of claim 1, wherein a) the cyanate ester based resin having at least two cyanate groups in one molecule is a compound represented by the following Formula 1:

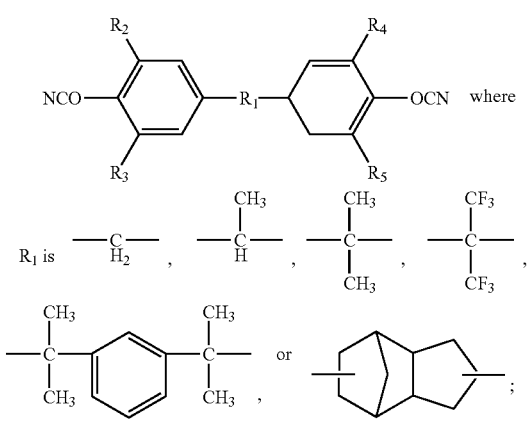

and each of $R_2$, $R_3$, $R_4$ and $R_5$ is hydrogen or $CH_3$, independently.

4. The thermosetting resin composition of claim 3, wherein a) the cyanate ester based resin having at least two cyanate groups in one molecule is at least one selected from the group consisting of 2,2-bis(4-cyanatephenyl)propane, bis(3,5-dimethyl-4-cyanatephenyl)methane and 2,2-bis(4-cyanatephenyl)-1,1,1,3,3,3-hexafluoropropane.

5. The thermo setting resin composition of claim 1, wherein b) the dicyclopentadiene based epoxy resin is a compound represented by the following Formula 2:

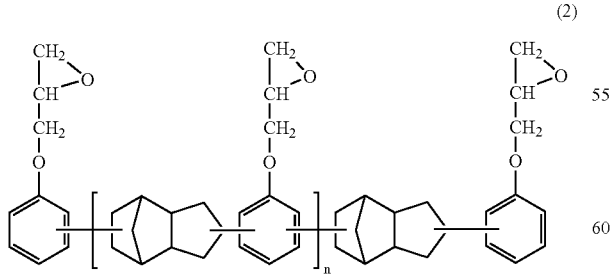

where n is 0 or a positive integer.

6. The thermosetting resin composition of claim 1, wherein c) the fumed silica has an average diameter ranging from 1 to 100 nm.

7. The thermosetting resin composition of claim 1, wherein d) the thermoplastic resin is at least one selected from the group consisting of polystyrene, cyclic olefin copolymer, polyphenylene ether and polyphenylene ether having an epoxy group.

8. The thermosetting resin composition of claim 1, wherein e) the cyanate ester resin curing accelerator is at least one selected from the group consisting of iron naphthenate, copper naphthenate, zinc naphthenate, cobalt naphthenate, iron octanoate, copper octanoate, zinc octanoate, cobalt octanoate, lead acetylacetonate and cobalt acetylacetonate.

9. The thermosetting resin composition of claim 1, wherein f) the epoxy resin curing accelerator is at least one selected from the group consisting of 1-methylimidazole, 2-methylimidazole, 2-ethyl-4-methylimidazole, 2-phenylimidazole, 2-cyclohexyl-4-methylimidazole, 4-butyl-5-ethylimidazole, 2-methyl-5-ethylimidazole, 2-octyl-4-hexylimidazole and 2,5-chloro-4-ethylimidazole.

10. The thermosetting resin composition of claim 1, wherein g) the primary phenolic compound is a compound represented by the following Formula 3:

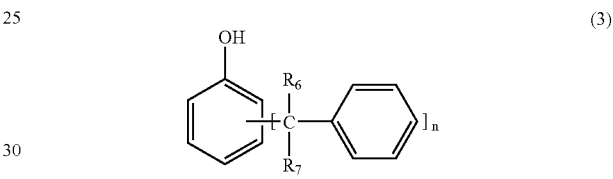

where
each of $R_6$ and $R_7$ is hydrogen or $CH_3$, independently; and
n is 1 or 2.

11. The thermosetting resin composition of claim 10, wherein the primary phenolic compound is at least one selected from the group consisting of nonylphenol, dinonyiphenol, octyiphenol and 4-cumylphenol.

12. The thermosetting resin composition of claim 1, wherein h) the flame retardant is at least one selected from the group consisting of 1,2-dibromo-4-(1,2-dibromoethyl)cyclohexane, tetrabromocyclohexane, hexabromocyclodecane and 2,4,6-tris (tribromophenoxy)-1,3,5-triazine represented by the following Formula 4:

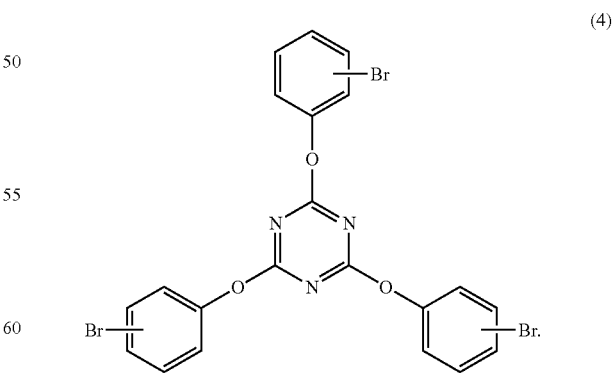

13. A copper clad laminate for high speed signal transfer comprising the thermosetting resin composition of claim 1.

* * * * *